United States Patent
Ju et al.

(10) Patent No.: US 9,378,811 B2
(45) Date of Patent: Jun. 28, 2016

(54) METHODS OF OPERATING VARIABLE RESISTANCE MEMORY DEVICES

(71) Applicant: Samsung Electronics Co., Ltd., Suwon-si (KR)

(72) Inventors: Hyunsu Ju, Hwaseong-si (KR); Min Kyu Yang, Hwaseong-si (KR); Eunmi Kim, Hwaseong-si (KR); Seonggeon Park, Yongin-si (KR); Ingyu Baek, Seoul (KR)

(73) Assignee: Samsung Electronics Co., Ltd. (KR)

( * ) Notice: Subject to any disclaimer, the term of this patent is extended or adjusted under 35 U.S.C. 154(b) by 1 day.

(21) Appl. No.: 14/021,412

(22) Filed: Sep. 9, 2013

(65) Prior Publication Data

US 2014/0078812 A1 Mar. 20, 2014

(30) Foreign Application Priority Data

Sep. 14, 2012 (KR) .................. 10-2012-0101870

(51) Int. Cl.
*G11C 13/00* (2006.01)

(52) U.S. Cl.
CPC ........ *G11C 13/0002* (2013.01); *G11C 13/0007* (2013.01); *G11C 13/0069* (2013.01); *G11C 2013/0083* (2013.01); *G11C 2213/15* (2013.01); *G11C 2213/32* (2013.01); *G11C 2213/76* (2013.01)

(58) Field of Classification Search
None
See application file for complete search history.

(56) References Cited

U.S. PATENT DOCUMENTS

| 6,504,779 | B2 | 1/2003 | Perner | |
|---|---|---|---|---|
| 7,382,647 | B1 | 6/2008 | Gopalakrishnan | |
| 7,515,454 | B2 * | 4/2009 | Symanczyk | ....... G11C 11/5614 257/154 |
| 7,894,239 | B2 | 2/2011 | Tamai et al. | |
| 8,062,918 | B2 | 11/2011 | Miller et al. | |
| 8,116,116 | B2 | 2/2012 | Hwang et al. | |
| 8,203,873 | B2 | 6/2012 | Gopalakrishnan | |
| 8,278,640 | B2 | 10/2012 | Lee et al. | |
| 2006/0097343 | A1 * | 5/2006 | Parkinson | .......... G11C 13/0004 257/528 |
| 2007/0018219 | A1 * | 1/2007 | Lim | ....................... H01L 45/04 257/296 |
| 2010/0027319 | A1 | 2/2010 | Noshiro | |
| 2010/0065803 | A1 | 3/2010 | Choi et al. | |
| 2010/0140578 | A1 * | 6/2010 | Tian | ................... H01L 27/2436 257/2 |
| 2010/0195371 | A1 | 8/2010 | Ohba et al. | |
| 2010/0224849 | A1 | 9/2010 | Kang | |
| 2010/0237311 | A1 | 9/2010 | Okajima | |
| 2010/0301988 | A1 | 12/2010 | Czubatyj et al. | |
| 2011/0031466 | A1 | 2/2011 | Kagawa et al. | |
| 2011/0198554 | A1 | 8/2011 | Iijima et al. | |

(Continued)

FOREIGN PATENT DOCUMENTS

| JP | 2008-182154 | 8/2008 |
|---|---|---|
| JP | 2009-043757 | 2/2009 |

(Continued)

*Primary Examiner* — Shawki S Ismail
*Assistant Examiner* — Muhammad Islam
(74) *Attorney, Agent, or Firm* — Myers Bigel & Sibley, P.A.

(57) ABSTRACT

A method of operating a resistive non-volatile memory can be provided by applying a forming voltage across first and second electrodes of a selected memory cell in the variable resistance non-volatile memory device during an operation to the selected memory cell. The forming voltage can be a voltage level that is limited to less than a breakdown voltage of an insulation film included in selected memory cell between a variable resistance film and one of first electrode. Related devices and materials are also disclosed.

18 Claims, 5 Drawing Sheets

(56) References Cited

U.S. PATENT DOCUMENTS

| | | | |
|---|---|---|---|
| 2011/0291066 A1* | 12/2011 | Baek | H01L 45/08 257/4 |
| 2011/0294259 A1* | 12/2011 | Kanzawa | G11C 13/0007 438/104 |
| 2011/0317470 A1* | 12/2011 | Lu | G11C 13/0007 365/148 |
| 2012/0008366 A1 | 1/2012 | Lu | |
| 2012/0008370 A1* | 1/2012 | Yasuda | H01L 27/2436 365/148 |
| 2012/0018695 A1 | 1/2012 | Lee et al. | |
| 2012/0074374 A1 | 3/2012 | Jo | |
| 2012/0091420 A1* | 4/2012 | Kusai et al. | 257/4 |
| 2012/0199805 A1* | 8/2012 | Sorada | H01L 27/101 257/2 |

FOREIGN PATENT DOCUMENTS

| | | |
|---|---|---|
| JP | 2011-009344 | 1/2011 |
| JP | 2011-035278 | 2/2011 |
| JP | 2012-019042 | 1/2012 |
| KR | 1020110081490 | 7/2011 |
| KR | 1020110114038 | 10/2011 |
| KR | 1020110132125 | 12/2011 |

\* cited by examiner

METHODS OF OPERATING VARIABLE RESISTANCE MEMORY DEVICES

CROSS-REFERENCE TO RELATED APPLICATIONS

A claim for priority under 35 U.S.C. §119 is made to Korean Patent Application No. 10-2012-0101870 filed Sep. 14, 2012, in the Korean Intellectual Property Office, the entire contents of which are hereby incorporated by reference.

BACKGROUND

The inventive concepts described herein relate to a variable resistance memory device and an operating method thereof.

Next-generation semiconductor memory devices can include ferroelectric random access memory (FRAM), magnetic RAM (MRAM), phase-change RAM (PRAM), and the like. Resistance values of materials used to form these next-generation semiconductor memory devices may vary according to a current or a voltage. Although a supply of a current or a voltage may be interrupted, the resistance values should be maintained even in highly integrated devices.

SUMMARY

Embodiments according to the inventive concept can provide methods of operating variable resistance memory devices and related variable resistance memory devices. Pursuant to these embodiments, a method of operating a variable resistance memory device including a first electrode and a second electrode opposed to each other, a variable resistance film between the first electrode and the second electrode, and at least one insulation film between the variable resistance film and the second electrode that has a dielectric constant that is different from the variable resistance film, can be providing by applying a forming voltage to the first electrode or the second electrode during a programming operation of the variable resistance memory device. The forming voltage can be a voltage between a breakdown voltage of the variable resistance film and a breakdown voltage of the insulation film.

In some embodiments according to the invention, the insulation film is at least one selected from a group of an aluminum oxide film (AlOx), an aluminum oxynitride film (AlOxNy), a silicon oxide film (SiOx), a silicon nitride film (SiNx), a silicon oxy nitride film (SiOxNy), a hafnium oxide film (HfOx), a zirconium oxide film (ZrOx), a titanium oxide film (TiOx), a lanthanum oxide film (LaOx), a strontium oxide film (SrOx), an aluminum-doped titanium oxide film (Al-doped TiOx), a hafnium silicon oxide film (HfSiOx), and a hafnium silicon oxynitride film (HfSiOxNy).

In some embodiments according to the invention, an equivalent oxide thickness of the insulation film is less than 5 nm. In some embodiments according to the invention, applying a forming voltage can be provided by forming an electric path in the variable resistance film but not in the insulation film.

In some embodiments according to the invention, the first electrode can be a first conductive line, the second electrode extends can be a second conductive line, and the variable resistance film and the insulation film can be disposed at an intersection of the first conductive line and the second conductive line. Applying a forming voltage can be provided by applying the forming voltage to the first conductive line and applying 0V to the second conductive line during the programming operation.

In some embodiments according to the invention, the method can further include applying 0V to the first conductive line and applying the forming voltage to the second conductive line during an erase operation of the variable resistance memory device.

In some embodiments according to the invention, the insulation film can include a plurality of insulation films, wherein the forming voltage can be a voltage between a breakdown voltage of one of the plurality of insulation films that is closest to the second electrode and a breakdown voltage of another of the plurality of insulation films that is closest to the variable resistance film among the insulation films.

Another aspect of embodiments of the inventive concept is directed to provide a variable resistance memory device comprising a first conductive line; a second conductive line crossing over the first conductive line; a plurality of resistors disposed in series between the first conductive line and the second conductive line at a cross point of the first conductive line and the second conductive line.

In example embodiments, a resistor adjacent to the first conductive line among the resistors includes a transition metal oxide, and a resistor adjacent to the second conductive line is at least one selected from a group of an aluminum oxide film (AlOx), an aluminum oxynitride film (AlOxNy), a silicon oxide film (SiOx), a silicon nitride film (SiNx), a silicon oxy nitride film (SiOxNy), a hafnium oxide film (HfOx), a zirconium oxide film (ZrOx), a titanium oxide film (TiOx), a lanthanum oxide film (LaOx), a strontium oxide film (SrOx), an aluminum-doped titanium oxide film (Al-doped TiOx), a hafnium silicon oxide film (HfSiOx), and a hafnium silicon oxynitride film (HfSiOxNy).

A method of operating a resistive non-volatile memory can be provided by applying a forming voltage across first and second electrodes of a selected memory cell in the variable resistance non-volatile memory device during an operation to the selected memory cell. The forming voltage can be a voltage level that is limited to less than a breakdown voltage of an insulation film included in selected memory cell between a variable resistance film and one of first electrode.

DETAILED DESCRIPTION OF EMBODIMENTS ACCORDING TO THE INVENTIVE CONCEPT

Figure 1:
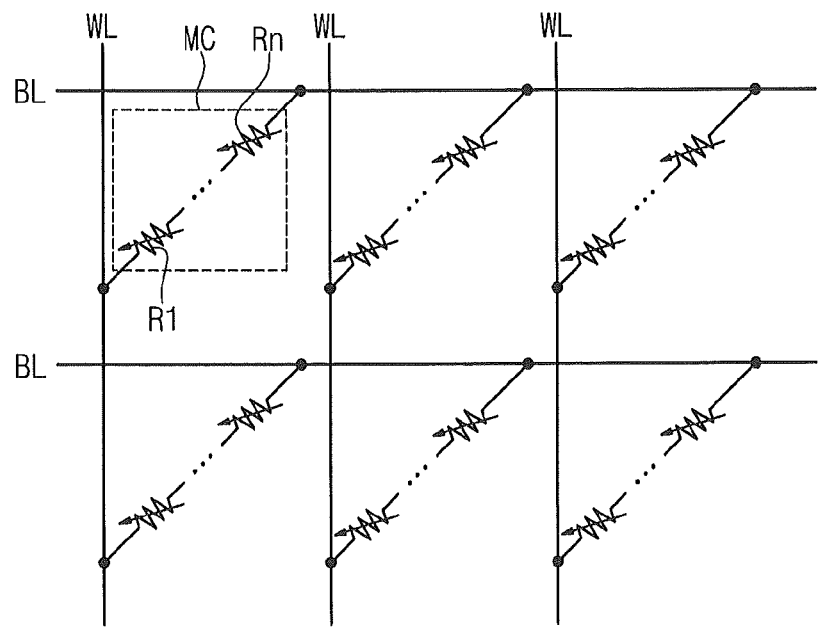
FIG. 1 is a circuit diagram schematically illustrating a variable resistance memory device according to an embodiment of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

It will be understood that, as used herein, a voltage can be described as being applied "across" two elements, such as a wordline and a bitline. Moreover, the voltage across the elements can be specified relative to either of the elements. Still further the voltage across the elements can be described by the specifying voltage levels applied to the specific elements, such as a forming voltage level being applied to a first element and 0 volts being applied to the second element to provide the forming voltage across the elements.

FIG. 1 is a circuit diagram schematically illustrating a variable resistance memory device according to embodiments of the inventive concept.

Referring to FIG. 1, a variable resistance memory device according to an embodiment of the inventive concept may include a plurality of word lines WL and a plurality of bit lines BL which intersect one another. Memory cells MC may be arranged at cross points of the word lines WL and the bit lines BL, respectively. Each of the memory cells MC may have a plurality of resistors R1 to Rn connected in series between a corresponding word line and a corresponding bit line. In each memory cell MC, at least one of the resistors R1 to Rn may be a variable resistor and include a transition metal oxide film.

Figure 2:
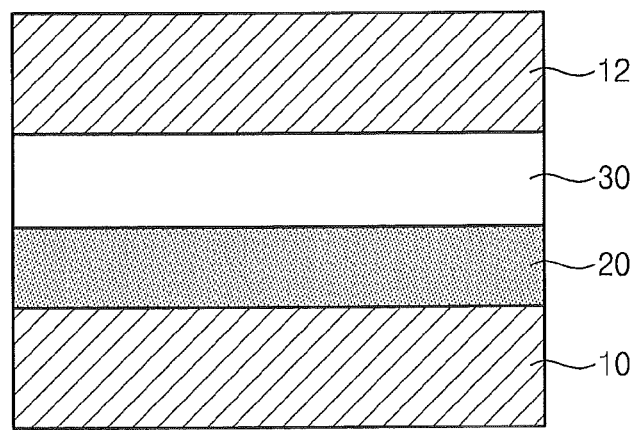
FIG. 2 is a cross-sectional view of a variable resistance memory device according to embodiments of the inventive concept.
Figure 3:
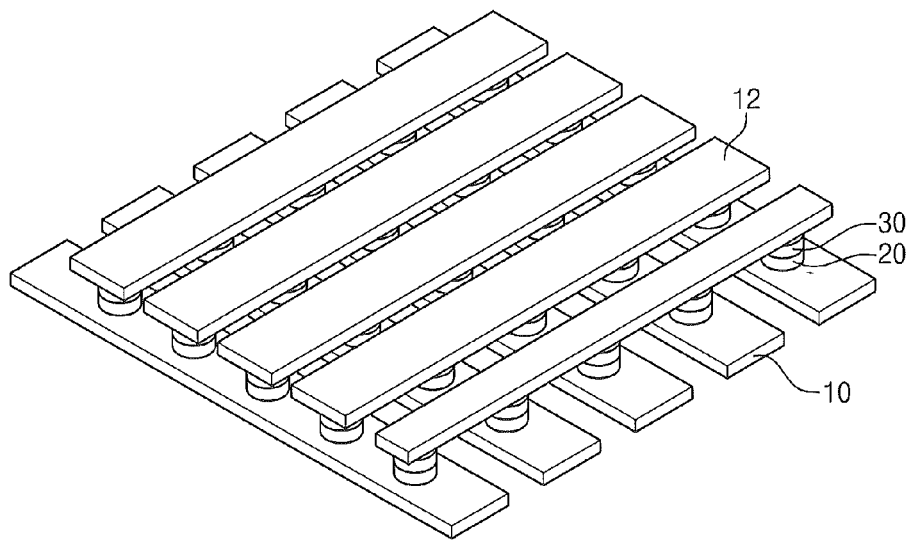
FIG. 3 is a perspective view of a part of a variable resistance memory device of FIG. 2.

FIG. 2 is a cross-sectional view of a variable resistance memory device according to an embodiment of the inventive concept. FIG. 3 is a perspective view of a part of a variable resistance memory device of FIG. 2.

Referring to FIGS. 1 to 3, a plurality of first conductive lines 10 may be arranged in parallel on a substrate, and may extend in a first direction. A plurality of second conductive lines 12 may be disposed in parallel on the first conductive lines 10. The second conductive lines 12 may extend in a direction crossing with the first direction. The first conductive lines 10 may correspond to word lines WL respectively, and the second conductive lines 12 may correspond to bit lines BL respectively. The conductive lines 10 and 12 may be a film having at least one of titanium nitride, tungsten, platinum, lead, rhodium, and ruthenium. A variable resistance film 20 and an insulation film 30 may be interposed between a first conductive line 10 and a second conductive line 12 to form a memory cell MC.

The variable resistance film 20 may correspond to a first resistor R1, and the insulation film 30 may correspond to a second resistor R2. That is, a variable resistance memory device in FIGS. 2 and 3 may have a structure in which a memory cell MC includes two resistors. The variable resistance film 20 may include a transition metal oxide film. The variable resistance film 20 may include an oxide of at least one selected from a group of zirconium (Zr), hafnium (Hf), aluminum (Al), nickel (Ni), copper (Cu), molybdenum (Mo), tantalum (Ta), titanium (Ti), and tungsten (W). However, a case can exist where a ratio of transition metal to oxygen does not satisfy a stoichiometry ratio. For example, in some embodiments the oxygen content can be 10% to 20% less than the stoichiometry content.

A dielectric constant of the insulation film 30 may be different from that of the variable resistance film 20. For example, the insulation film 30 may be at least one selected from a group of an aluminum oxide film (AlOx), an aluminum oxynitride film (AlOxNy), a silicon oxide film (SiOx), a silicon nitride film (SiNx), a silicon oxy nitride film (SiOxNy), a hafnium oxide film (HfOx), a zirconium oxide film (ZrOx), a titanium oxide film (TiOx), a lanthanum oxide film (LaOx), a strontium oxide film (SrOx), an aluminum-doped titanium oxide film (Al-doped TiOx), a hafnium silicon oxide film (HfSiOx), and a hafnium silicon oxynitride film (HfSiOxNy). A ratio of elements of the insulation film 30 may be approximate to the stoichiometry ratio rather than the variable resistance film 20. In some embodiments, an equivalent oxide thickness of the insulation film 30 is less than 5 nm.

The insulation film 30 may be a single film or a plurality of stacked insulation films having different dielectric constants.

In a program operation of the variable resistance memory device, a forming voltage (sufficient to form an electric path such as a filament in the variable resistance film 20) may be applied to a selected first conductive line 10, and 0V may be applied to a selected second conductive line 12. 0V may be applied to unselected conductive lines 10 and 12. Under these conditions, an electric path (such as a filament) may be formed in the variable resistance film 20 of a selected memory cell MC.

The forming voltage may be a voltage having a value that is between a breakdown voltage of the insulation film 30 (that is adjacent to the second conductive line 12) and a breakdown voltage of the variable resistance film 20. If the insulation film 30 is formed of a plurality of stacked insulation films having different dielectric constants, the forming voltage may have a value that is between a breakdown voltage of an insulation film that is closest to the second conductive line 12 and a breakdown voltage of another insulation film that is closest to the variable resistance film 20.

In an erase operation of the variable resistance memory device, 0V may be applied to a selected first conductive line 10, and the forming voltage may be applied to a selected second conductive line 12. 0V may be applied to unselected conductive lines 10 and 12. Under these conditions, an electric path (such as a filament formed in the variable resistance film 20) in a selected memory cell MC may be removed.

In some embodiments, a read voltage doing a read operation of the variable resistance memory device may be about half the forming voltage.

Figure 4:
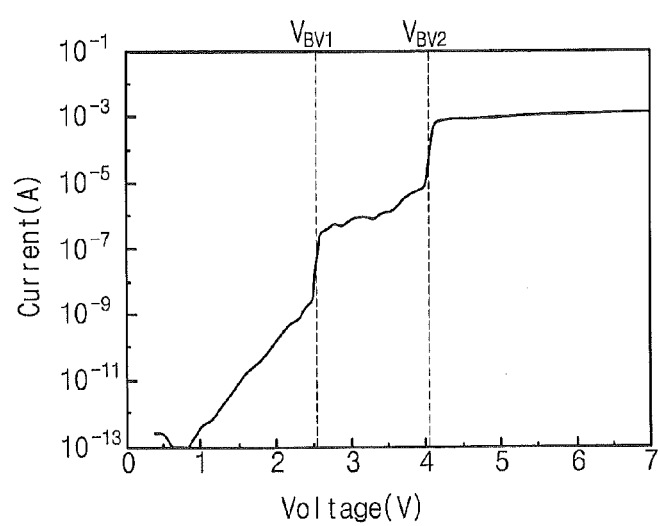
FIGS. 4 and 5 are graphs illustrating current-voltage relationships in a variable resistance memory device according to embodiments of the inventive concept.
Figure 5:
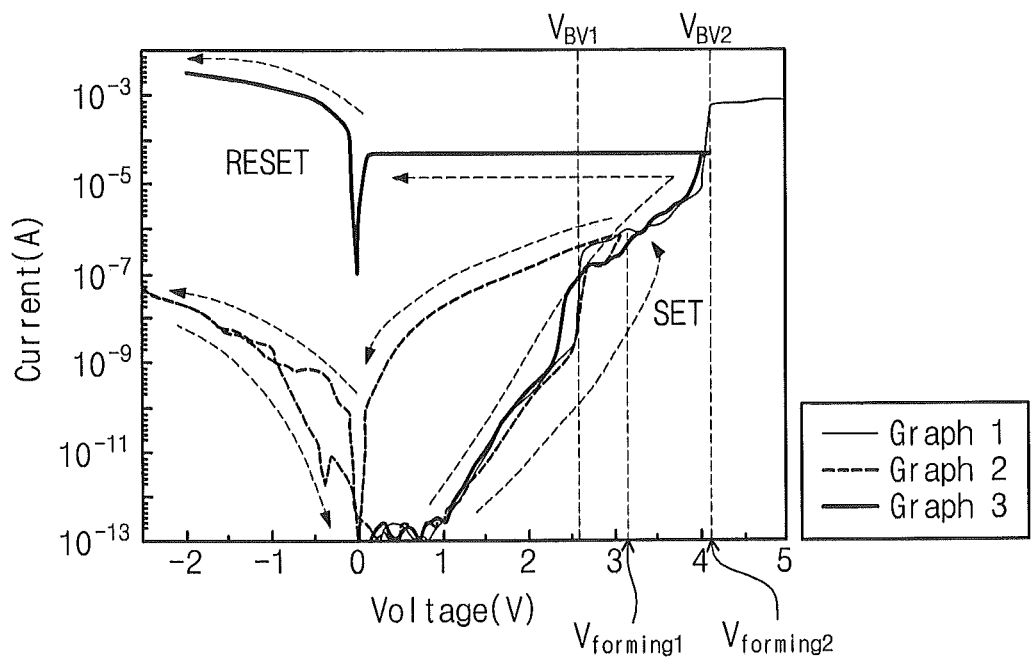

FIGS. 4 and 5 are graphs illustrating a current-voltage relation in a variable resistance memory device according to some embodiments of the inventive concept.

A variable resistance memory device may be fabricated to have a structure in FIGS. 2 and 3. First and second conductive lines 12 may be formed of a titanium nitride film, and a variable resistance film 20 may be formed of a zirconium oxide film having a thickness of about 1.5 nm. The insulation film 30 may be formed of an aluminum oxide film. An equivalent oxide thickness of the insulation film 30 may be about 2 nm. A current may be measured by applying voltages to the first and second conductive lines 10 and 12 connected with a specific memory cell.

In FIG. 4, a horizontal axis may indicate a difference between a voltage applied to the first conductive line 10 and a voltage applied to the second conductive line 12. In the case that a voltage applied to the second conductive line 12 is 0V, the horizontal axis may indicate a voltage applied to the first conductive line 10. A vertical axis may indicate a current flowing via the variable resistance film 20 and the insulation film 30 comprising a memory cell MC.

Referring to FIG. 4, a current may gradually increase as a voltage increases. Also, the current may rapidly increase at a voltage of about 2.5 (a first breakdown voltage $V_{BV1}$). If the voltage continues to increase, the current may increase slowly. The current may also increase sharply at a voltage of about 4V (a second breakdown voltage $V_{BV2}$). Afterwards, although the voltage continues to increase, the current may remain substantially constant. The first breakdown voltage $V_{BV1}$ may correspond to a breakdown voltage of the variable resistance film 20. That is, an electric path (such as a filament) may be formed in the variable resistance film 20 at the first breakdown voltage $V_{BV1}$. The second breakdown voltage $V_{BV2}$ may correspond to a breakdown voltage of the insulation film 30. The first and second breakdown voltages $V_{BV1}$ and $V_{BV2}$ may vary according to materials, compositions, thicknesses, dielectric constants, and electric resistance of the variable resistance film 20 and the insulation film 30.

Since the insulation film 30 is interposed between the second conductive line 12 and the variable resistance film 20, two breakdown voltages may be provided association with the memory cells MC.

Referring to FIG. 5, a graph 1 may be the same as a graph in FIG. 4, and may indicate a current characteristic when a voltage continues to increase. As described above, the first and second breakdown voltages $V_{BV1}$ and $V_{BV2}$ may be shown at the graph 1. A graph 2 may indicate a current-voltage characteristic when a program voltage or a forming voltage $V_{forming1}$ of a variable resistance memory device is set to a voltage (e.g., about 3.1V) between the first breakdown voltage $V_{BV1}$ and the second breakdown voltage $V_{BV2}$. It is understood from the graph 2 that the variable resistance memory device stably operates at a low current level when the forming voltage is set as described above. A graph 3 may indicate a current-voltage characteristic when a forming voltage Vforming2 is set to be the same as the second breakdown voltage VBV2. As understood from the graph 3, the variable resistance memory may operate irreversibly, be unstable, and fail. The reason may be that the insulation film 30 is permanently damaged by the forming voltage $V_{forming2}$ set to a high voltage, that is, the second breakdown voltage $V_{BV2}$. Thus, it is possible to realize a variable resistance memory device having a self-rectifying characteristic using a self-compliance current limit function of the insulation film 30 by setting the forming voltage $V_{forming1}$ to a value between the first breakdown voltage $V_{BV1}$ of the variable resistance film 20 and the second breakdown voltage $V_{BV2}$ of the insulation film 30. As a result, the variable resistance memory device may operate stably and repeatedly.

Figure 6:
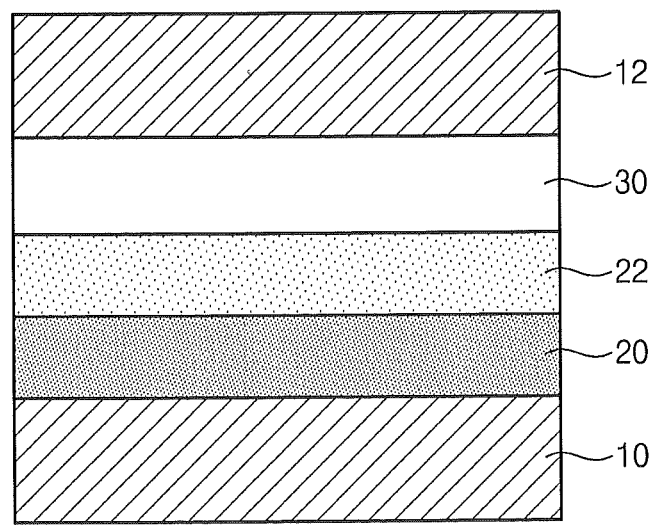
FIGS. 6 to 8 are cross-sectional views of a variable resistance memory device according to embodiments of the inventive concept.
Figure 7:
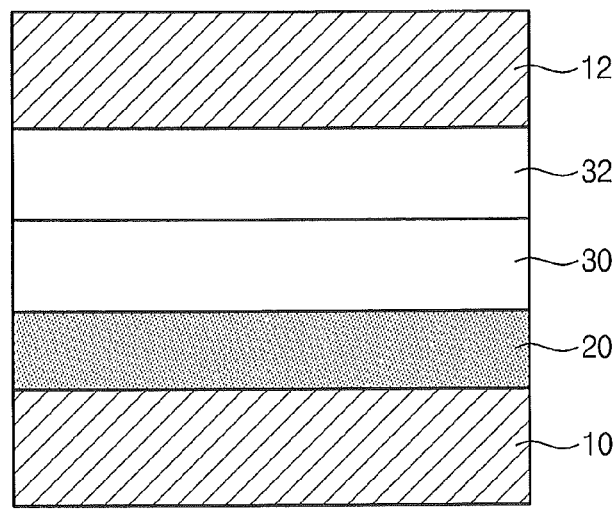
Figure 8:
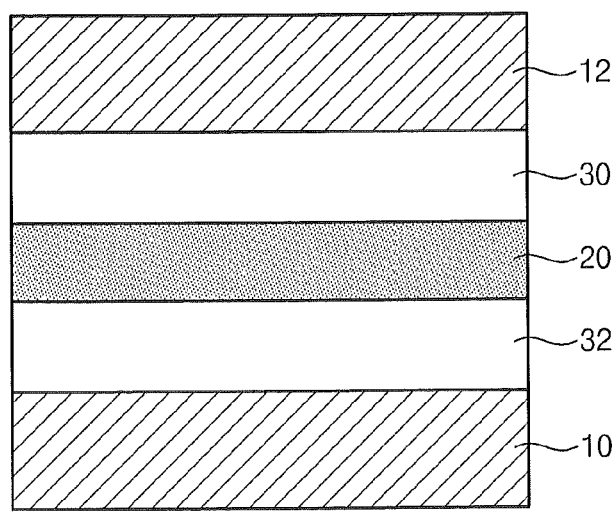

FIGS. 6 to 8 are cross-sectional views of a variable resistance memory device according to other embodiments of the inventive concept.

Referring to FIG. 6, an oxygen exchange film 22 may be interposed between a variable resistance film 20 and an insulation film 30. The oxygen exchange film 22 may contact with the variable resistance film 20. The oxygen exchange film 22 may be a film exchanging oxygen with the variable resistance film 20. When a variable resistance memory device is programmed, oxygen included in the variable resistance film 20 may move to the oxygen exchange film 22, so that an electric resistance of the variable resistance film 20 goes to a low resistance state. When the variable resistance memory device is erased, oxygen included in the oxygen exchange film 22 may move to the variable resistance film 20, so that an electric resistance of the variable resistance film 20 goes to a high resistance state. The oxygen exchange film 22 may be an oxide including the same transition metal as the variable resistance film 20. For example, the oxygen exchange film 22 may include oxide of at least one selected from a group of zirconium (Zr), hafnium (Hf), aluminum (Al), nickel (Ni), copper (Cu), molybdenum (Mo), tantalum (Ta), titanium (Ti), and tungsten (W). However, the oxygen content of the oxygen exchange film 22 may be more than that of the variable resistance film 20, but a case can exist where a ratio of transition metal to oxygen does not satisfy a stoichiometry ratio.

Referring to FIG. 7, an additional insulation film 32 may be interposed between the insulation film 30 and a second conductive line 12. The additional insulation film 32 may have a dielectric constant different from a variable resistance film 20 and the insulation film 30. The additional insulation film 32 may be at least one selected from a group of an aluminum oxide film (AlOx), an aluminum oxynitride film (AlOxNy), a silicon oxide film (SiOx), a silicon nitride film (SiNx), a silicon oxy nitride film (SiOxNy), a hafnium oxide film (HfOx), a zirconium oxide film (ZrOx), a titanium oxide film (TiOx), a lanthanum oxide film (LaOx), a strontium oxide film (SrOx), an aluminum-doped titanium oxide film (Al-doped TiOx), a hafnium silicon oxide film (HfSiOx), and a hafnium silicon oxynitride film (HfSiOxNy). In some embodiments, an equivalent oxide thickness of the additional insulation film 32 is less than 5 nm. A variable resistance memory device may have three breakdown voltages provided by the variable resistance film 20, the insulation film 30, and the additional insulation film 32 which are interposed between a first conductive line 10 and a second conductive line 12. In this arrangement, a forming voltage may be less than a breakdown voltage of the additional insulation film 32 that is closest to the second conductive line 12.

Referring to FIG. 8, an additional insulation film 32 may be interposed between a variable resistance film 20 and a first conductive line 10. In this embodiment, a forming voltage may be less than a breakdown voltage of the insulation film 30 closest to a second conductive line 12.

Figure 9:
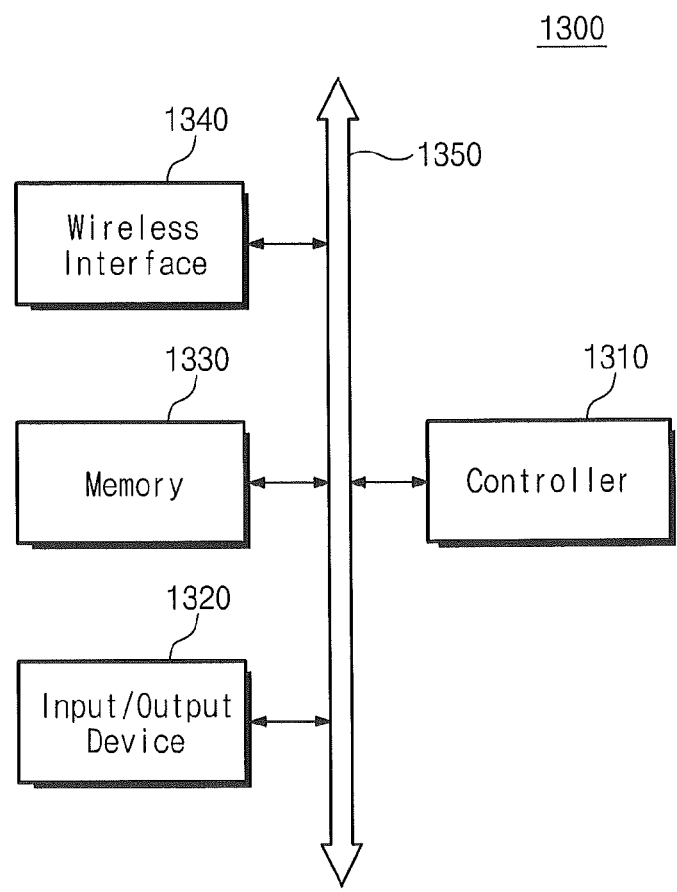
FIGS. 9 and 10 are block diagrams schematically illustrating electronic devices including a semiconductor device according to embodiments of the inventive concept.
Figure 10:
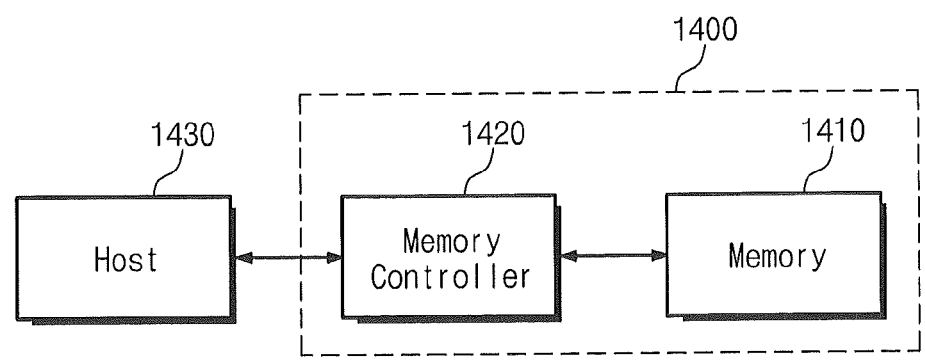

FIGS. 9 and 10 are block diagrams schematically illustrating electronic devices including a semiconductor device according to embodiments of the inventive concept.

Referring to FIG. 9, an electronic device 1300 including a semiconductor device according to an embodiment of the inventive concept may a PDA, a laptop computer, a portable computer, a web tablet, a cordless phone, a cellular phone, a digital music player, a wire and wireless electronic device, or a complex electronic device including at least two thereof. The electronic device 1300 may include a controller 1310, an input/output device 1320 such as a keypad, a keyboard, and a display, a memory 1330, and a wireless interface 1340 which are interconnected via a bus 1350. The controller 1310 may include one or more microprocessors, a digital signal processor, a microcontroller, or the like. The memory 1330 may be used to store commands executable by the controller 1310. The memory 1330 may be used to store user data, and may include a semiconductor device according to embodiments of the inventive concept. The electronic device 1300 may use the wireless interface 1340 to send data to an RF communications network performing RF communications and to receive data from a network. For example, the wireless interface 1340 may include a wireless transceiver. The electronic device 1300 may be used to implement the communications interface protocol of a communications system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, and so on.

Referring to FIG. 10, a semiconductor device according to embodiments of the inventive concept may be used to implement a memory system. A memory system 1400 may include a memory device 1410 storing mass data and a memory controller 1420. The memory controller 1420 may control the memory device 1410 in response to a read/write request of a host 1430 to read or write data from or to the memory device 1410. The memory controller 1420 may include an address mapping table for mapping an address from the host 1430 (e.g., a mobile device or a computer system) to a physical address of the memory device 1410. The memory device 1410 may include a semiconductor device according to embodiments of the inventive concept.

In example embodiments, semiconductor devices according to embodiments of the inventive concept may be implemented by a variety of semiconductor packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), and so on.

A package at which a semiconductor device according to embodiments of the inventive concept is mounted may further comprise a controller controlling the semiconductor device and/or logic elements.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A method of operating a variable resistance memory device including a first electrode and a second electrode opposed to each other, a variable resistance film between the first electrode and the second electrode, and at least one insulation film between the variable resistance film and the second electrode and having a dielectric constant that is different from the variable resistance film, the method comprising:
applying a forming voltage to the first electrode or the second electrode during a programming operation of the variable resistance memory device to form/remove a conductive filament through the variable resistance film, the forming voltage is limited to between a breakdown voltage of the variable resistance film and a breakdown voltage of the insulation film, wherein the breakdown voltage of the variable resistance film is less than the breakdown voltage of the insulation film.

2. The method of claim 1, wherein the insulation film is at least one selected from a group of an aluminum oxide film (AlOx), an aluminum oxynitride film (AlOxNy), a silicon oxide film (SiOx), a silicon nitride film (SiNx), a silicon oxy nitride film (SiOxNy), a hafnium oxide film (HfOx), a zirconium oxide film (ZrOx), a titanium oxide film (TiOx), a lanthanum oxide film (LaOx), a strontium oxide film (SrOx), an aluminum-doped titanium oxide film (Al-doped TiOx), a hafnium silicon oxide film (HfSiOx), and a hafnium silicon oxynitride film (HfSiOxNy).

3. The method of claim 1, wherein an equivalent oxide thickness of the insulation film is less than 5 nm.

4. The method of claim 1, wherein applying a forming voltage comprises forming an electric path in the variable resistance film but is not formed in the insulation film.

5. The method of claim 1, wherein the first electrode comprises a first conductive line, the second electrode extends comprises a second conductive line, and the variable resistance film and the insulation film are disposed at an intersection of the first conductive line and the second conductive line, and wherein applying a forming voltage comprises:
applying the forming voltage to the first conductive line and applying 0V to the second conductive line during the programming operation.

6. The method of claim 1, wherein the insulation film comprises a plurality of insulation films, wherein the forming voltage comprises a voltage between a breakdown voltage of one of the plurality of insulation films that is closest to the second electrode and a breakdown voltage of another of the plurality of insulation films that is closest to the variable resistance film among the insulation films.

7. The method of claim 5 further comprising:
applying 0V to the first conductive line and applying the forming voltage to the second conductive line during an erase operation of the variable resistance memory device.

8. A method of operating a variable resistance non-volatile memory device, the method comprising:
applying a forming voltage across first and second electrodes of a selected memory cell in the variable resistance non-volatile memory device during a programming operation to the selected memory cell to form/remove a conductive filament through a variable resistance film included in the variable resistance non-volatile memory device, the forming voltage is limited to less than a breakdown voltage of an insulation film on the variable resistance, wherein a breakdown voltage of the variable resistance film is less than the breakdown voltage of the insulation film.

9. The method of claim 8 wherein applying a forming voltage comprises applying the forming voltage level to a wordline for the selected memory cell and applying 0 Volts to a bitline for the selected memory cell during a programming operation to the selected memory cell.

10. The method of claim 8 wherein applying a forming voltage comprises applying a forming voltage level to a bitline for the selected memory cell that is less than the breakdown voltage and applying 0 Volts to a wordline for the selected memory cell during an erase operation to the selected memory cell.

11. The method of claim 8 wherein the insulation film comprises a plurality of insulation films, wherein the breakdown voltage of the insulation film comprises a breakdown voltage of one of the plurality of insulation films that is located closest to the first electrode.

12. The method of claim 8 wherein the insulation film comprises a transition metal oxide.

13. The method of claim 8 wherein the voltage level limited to less than the breakdown voltage of an insulation film is sufficient to form an electric path in the variable resistance film but insufficient to form an electric path in the insulation film.

14. The method of claim 8 wherein an equivalent oxide thickness of the insulation film is less than 5 nm.

15. The method of claim 9 wherein the insulation film is located between the variable resistance film and the bitline.

16. The method of claim 9 wherein applying a forming voltage comprises applying the forming voltage level that is limited to less than the breakdown voltage of the insulation film and greater than a breakdown voltage of the variable resistance film.

17. The method of claim 10 wherein the insulation film is located between the variable resistance film and the bitline.

18. The method of claim 12 wherein the transition metal oxide comprises at least one selected from a group of an aluminum oxide film (AlOx), an aluminum oxynitride film (AlOxNy), a silicon oxide film (SiOx), a silicon nitride film (SiNx), a silicon oxy nitride film (SiOxNy), a hafnium oxide film (HfOx), a zirconium oxide film (ZrOx), a titanium oxide film (TiOx), a lanthanum oxide film (LaOx), a strontium oxide film (SrOx), an aluminum-doped titanium oxide film (Al-doped TiOx), a hafnium silicon oxide film (HfSiOx), and a hafnium silicon oxynitride film (HfSiOxNy).

* * * * *